US011498097B2

(12) United States Patent
Kumar et al.

(10) Patent No.: US 11,498,097 B2
(45) Date of Patent: Nov. 15, 2022

(54) PIEZOELECTRIC MICROMACHINED ULTRASONIC TRANSDUCER AND METHOD OF FABRICATING THE SAME

(71) Applicant: Vanguard International Semiconductor Corporation, Hsinchu (TW)

(72) Inventors: Rakesh Kumar, Singapore (SG); Jia Jie Xia, Singapore (SG); You Qian, Singapore (SG)

(73) Assignee: Vanguard International Semiconductor Corporation, Hsinchu (TW)

( * ) Notice: Subject to any disclaimer, the term of this patent is extended or adjusted under 35 U.S.C. 154(b) by 299 days.

(21) Appl. No.: 16/880,956

(22) Filed: May 21, 2020

(65) Prior Publication Data

US 2021/0362189 A1    Nov. 25, 2021

(51) Int. Cl.
*B06B 1/06*  (2006.01)
*B81B 3/00*  (2006.01)
*B81C 1/00*  (2006.01)

(52) U.S. Cl.
CPC .......... *B06B 1/0666* (2013.01); *B81B 3/0021* (2013.01); *B81C 1/00158* (2013.01); *B81B 2201/0271* (2013.01); *B81B 2203/0127* (2013.01); *B81B 2203/0315* (2013.01); *B81C 2201/0109* (2013.01); *B81C 2201/0133* (2013.01)

(58) Field of Classification Search
CPC ... B06B 1/0666; B06B 1/0651; B81B 3/0021; B81B 2201/0271; B81B 2203/0127; B81B 2203/0315; B81B 2207/053; B81C 1/00158; B81C 2201/0109; B81C 2201/0133; B81C 1/00476; B81C 2201/014

See application file for complete search history.

(56) References Cited

U.S. PATENT DOCUMENTS

2014/0214209 A1   7/2014  Sugiura
2020/0194658 A1   6/2020  Guedes

FOREIGN PATENT DOCUMENTS

WO   WO-2009126352 A2 * 10/2009  .......... B01F 13/0059
WO   2016106153      6/2016

* cited by examiner

*Primary Examiner* — Douglas W Owens
(74) *Attorney, Agent, or Firm* — Winston Hsu

(57) ABSTRACT

A piezoelectric micromachined ultrasonic transducer (PMUT) includes a substrate, a stopper, and a membrane, where the substrate and the stopper are composed of same single-crystalline material. The substrate has a cavity penetrating the substrate, and the stopper protrudes from a top surface of the substrate and surrounds the edge of the cavity. The membrane is disposed over the cavity and attached to the stopper.

20 Claims, 10 Drawing Sheets

PIEZOELECTRIC MICROMACHINED ULTRASONIC TRANSDUCER AND METHOD OF FABRICATING THE SAME

BACKGROUND OF THE INVENTION

1. Field of the Invention

The present disclosure relates generally to the field of Micro Electro Mechanical Systems (MEMS), and more particularly to a piezoelectric micromachined ultrasonic transducer (PMUT) and a method of fabricating the same.

2. Description of the Prior Art

For the past few decades, micromachined ultrasonic transducers (MUTs) have been subject to extensive research and become an important component in various consumer electronics, such as fingerprint, proximity and gesture sensing. In general, MUTs could be categorized into two major types, capacitive micromachined ultrasonic transducers (CMUTs) or piezoelectric micromachined ultrasonic transducers (PMUTs). For a typical PMUT, the PMUT has a membrane consisting of elastic material, electrodes and piezoelectric material, and the membrane is disposed over a cavity acting as an acoustic resonator to improve acoustic performance of the PMUT. During the operation of the PMUT, an ultrasound wave generated by vibrating the membrane is transmitted from the PMUT to a target, and then the reflected wave generating after hitting the object could be detected by the PMUT.

Generally, PMUTs typically operate at the membrane's flexural resonant frequency, which is defined by selecting the correct materials, membrane size, and thickness. Thus, good matching of the resonant frequencies of the individual PMUTs is required for proper operation. However, since the cavity underneath the membrane is usually formed by etching the backside of the substrate, the opening of the cavity on the front side of the substrate which defines the membrane size may vary significantly across a wafer and from wafer-to-wafer, which inevitably causes the variation in resonant frequency of each PMUT.

Accordingly, there is a need to provide an improved PMUT with precise control of the membrane size and a method of fabricating the same.

SUMMARY OF THE INVENTION

In view of this, it is necessary to provide an improved PMUT and a method of fabricating the same in order to increase the uniformity of resonant frequency of the PMUT.

According to one embodiment of the present disclosure, a PMUT includes a substrate, a stopper, and a membrane, where the substrate and the stopper are composed of same single-crystalline material. The substrate has a cavity penetrating the substrate, and the stopper protrudes from a top surface of the substrate and surrounds the edge of the cavity. The membrane is disposed over the cavity and attached to the stopper.

According to another embodiment of the present disclosure, a method of fabricating a PMUT is disclosed and includes the following steps. First, a substrate is etched to form a stopper protruding from the substrate, and then a sacrificial layer is formed on the substrate, where the stopper is exposed from the sacrificial layer. Afterwards, a membrane layer is formed on the stopper and the sacrificial layer. A cavity penetrating the substrate is then formed to expose portions of the sacrificial layer. Subsequently, the portions of the sacrificial layer exposed from the cavity is removed by using the stopper as an etch stop structure.

According to the embodiments of the present disclosure, the stopper is a structure protruding from the top surface of the substrate, and the size of the membrane may be adjusted by controlling the position of the stopper. Since the stopper is fabricated by etching the substrate, the stopper may be tightly attached to the substrate without peeling off from the substrate and may have vertical sidewall. As a result, the reliability and electrical performance of the PMUT would be improved effectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
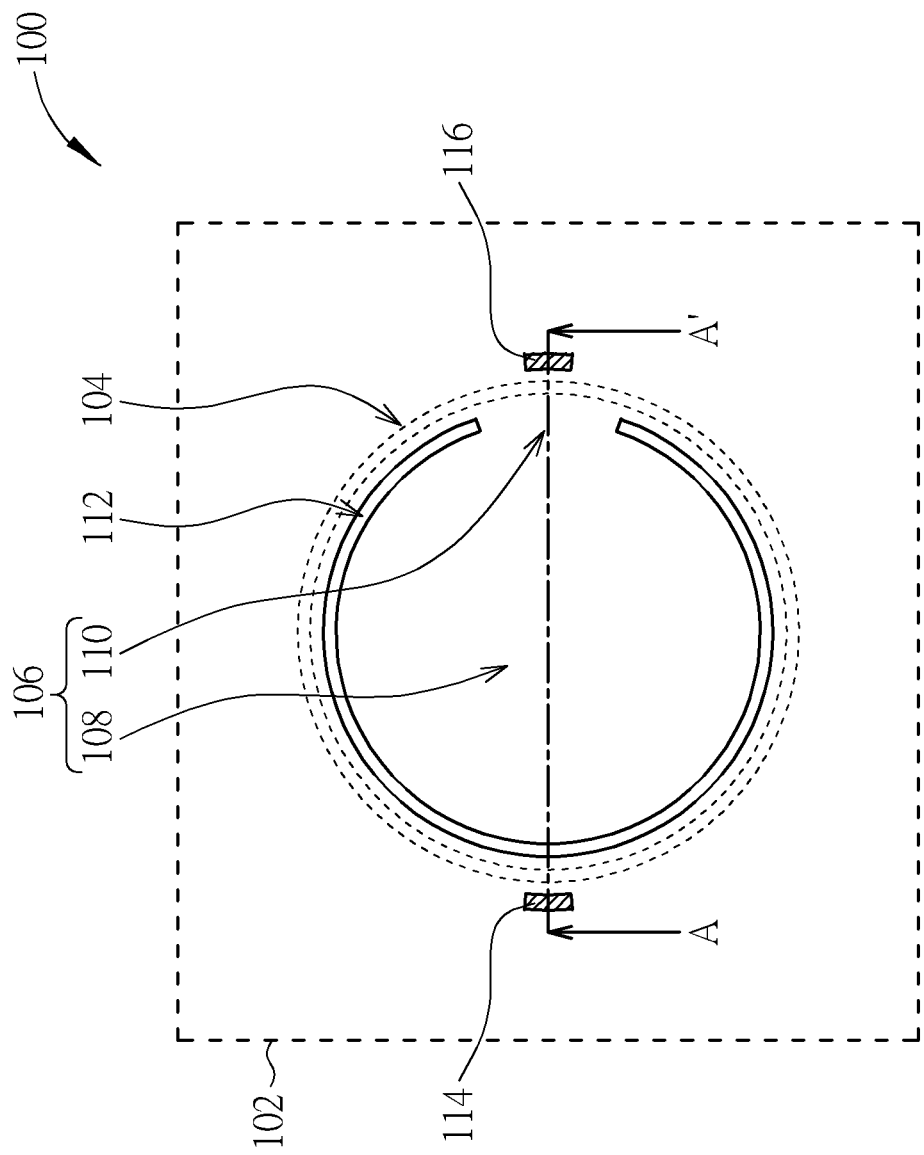
FIG. 1 is a schematic top view of a piezoelectric micromachined ultrasonic transducer (PMUT) in accordance with one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed indirect contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

It is understood that the specific order or hierarchy of blocks in the following disclosed processes/flowcharts is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the presented specific order or hierarchy.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

FIG. 1 is a schematic top view of a piezoelectric micromachined ultrasonic transducer (PMUT) in accordance with one embodiment of the present disclosure. Referring to FIG. 1, a PMUT 100 includes at least a substrate 102, a stopper 104, a membrane 106, an interrupted portion 112, and first and second contact pads 114 and 116. According to one embodiment of the present disclosure, the stopper 104 may be a ring-shaped structure protruding from the top surface of the substrate 102 so that portions of the membrane 106 may be attached to the stopper 104. The shape of the stopper 104 is not limited thereto, the stopper 104 may be polygon-shaped or arc-shaped disposed along an edge of the membrane. The membrane 106 may include a body portion 108 above a cavity (not shown) and a base portion 110 at the perimeter of the body portion 108. The shape of the body portion 108 may be defined by the shape of the interrupted portion 112 and may be of any shape, such as a circle, a circular sector, or a polygon. The stopper 104 may be disposed along the perimeter of the interrupted portion 112 as well as the perimeter of the body portion 108. The body portion 108 of the membrane 106 may be a multilayer structure including electrodes and piezoelectric material. The base portion 110 is attached to the stopper 104 and may be regarded as a portion extending from the body portion 108 of the membrane 106. The first contact pad 114 and the second contact pads 116 may be disposed at the opposite sides of the membrane 106, which may be respectively electrically coupled to the electrodes of the membrane 106. Besides, in order to avoid undesired parasitic capacitance between the first contact pad 114 and the second contact pads 116, the sizes of the contact pads 114 and 116 may be as small as possible, but not limited thereto. According to one embodiment of the present disclosure, the first contact pad 114 and the second contact pad 116 may be disposed at the same side of the membrane 106 or at any positions as long as the contact pads 114 and 116 may be electrically coupled to the electrodes of the membrane 106. Additional conductive traces (not shown) electrically coupled to the first contact pad 114 and the second contact pad 116 may be disposed on the substrate 102 so as to transmit electrical signals into or out of the membrane 106. During the operation of the PMUT 100, the membrane 106, especially the body portion 108 of the membrane 106, may vibrate when sound waves exerts acoustic pressure on or electrical signals are applied to the membrane 106. By using the stopper 104, the dimension and position of the membrane 106 may be precisely defined independently of the dimension and position of the cavity underneath the membrane 106. Accordingly, the uniformity of the resonant frequency of each PUMT 100 may be increased effectively.

Figure 2:
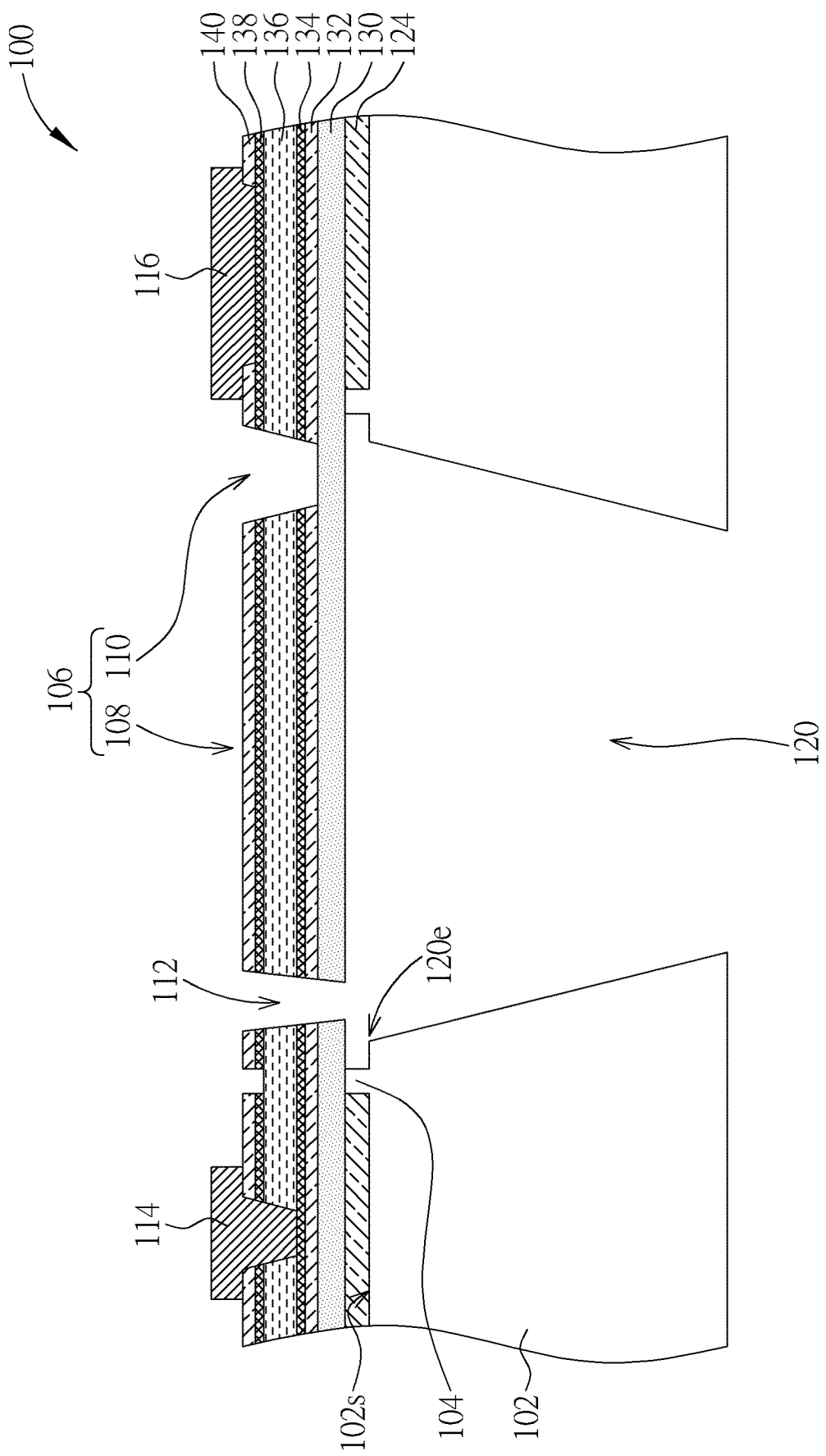
FIG. 2 is a schematic cross-sectional diagram taken along a line A-A' of FIG. 1 in accordance with one embodiment of the present disclosure.

FIG. 2 is a schematic cross-sectional diagram taken along a line A-A' of FIG. 1 in accordance with one embodiment of the present disclosure. Referring to FIG. 2, the stopper 104 may protrude from a top surface 102s of the substrate 102. The substrate 102 may be a semiconductor substrate, such as a bulk silicon substrate, but not limited thereto. The substrate 102 and the stopper 104 may be composed of the same material, such as single-crystalline silicon, poly silicon, amorphous silicon, glass, ceramic material, or other suitable material. According to one embodiment of the present disclosure, the substrate 102 may be SOI substrate. A sacrificial layer 124 having a composition different from the compositions of the substrate 102, the stopper 104 is disposed on the substrate 102 and the sacrificial layer 124 surround the stopper 104. According to one embodiment of the present disclosure, the sacrificial layer 124 may be a dielectric layer, such as silicon oxide ($SiO_x$) or silicon dioxide (SiO$_2$), in a case where the substrate 102 and/or the stopper 104 are composed of semiconductor material, such as Si. Besides, the top surface of the sacrificial layer 124 may be substantially level with the top surface of the stopper 104 so that the layer disposed on the sacrificial layer 124 and the stopper 104 may have a flat bottom surface. Referring to FIG. 2, although the width of the stopper 104 is much less than the width of the sacrificial layer 124, the stopper 104 may be designed to have a width greater than the width of the sacrificial layer 124 according to another embodiment of the present disclosure. Moreover, according to another embodiment of the present disclosure, most of the sacrificial layer 124 may be replaced with the stopper 104 when the width of the stopper 104 is large enough. A stacking layer, including a base layer 130, a dielectric layer 132, a bottom conductive layer 134, a piezoelectric layer 136, a top conductive layer 138, and a passivation layer 140, may be sequentially disposed on the substrate 102. Portions of the stacking layer may be disposed over a cavity 120 having an edge 120e in proximity to the stacking layer, and the stopper 104 may surround the edge 120e of the cavity 120. Thus, the stacking layer disposed over a cavity 120 may constitute the membrane 106. Besides, the membrane 106 may be penetrated by the interrupted portion 112 so as to release stress in the stacking layer. Specifically, the base layer 130 of the membrane 106 may have required elasticity so that the membrane 106 may vibrate at the certain frequency when sound waves or electrical signals are applied to the membrane 106. The bottom conductive layer 134 and the top conductive layer 138 of the membrane 106 may be respectively electrically coupled to the first contact pad 114 and the second contact pad 116. It should be noted that the mechanical behavior of the membrane 106 is mainly dominated by the base layer 130 of the membrane 106 because the thickness of the stacking layer disposed over the base layer 130 is much less than the thickness of the base layer 130. For example, the entire thickness of the stacking layer constituted by the dielectric layer 132, the bottom conductive layer 134, the piezoelectric layer 136, the top conductive layer 138, and the passivation layer 140 may be only ⅓ to ⅒ of the thickness of the underlying base layer 130.

In order to enable one of ordinary skill in the art to implement the present disclosure, a method of fabricating a PMUT is further described below. Besides, as a PMUT may be fabricated by standard CMOS processes, associated electronics, such as FET, amplifiers, and integrated circuits, may also be fabricated on the same substrate of the PMUT by the same CMOS process.

Figure 3:
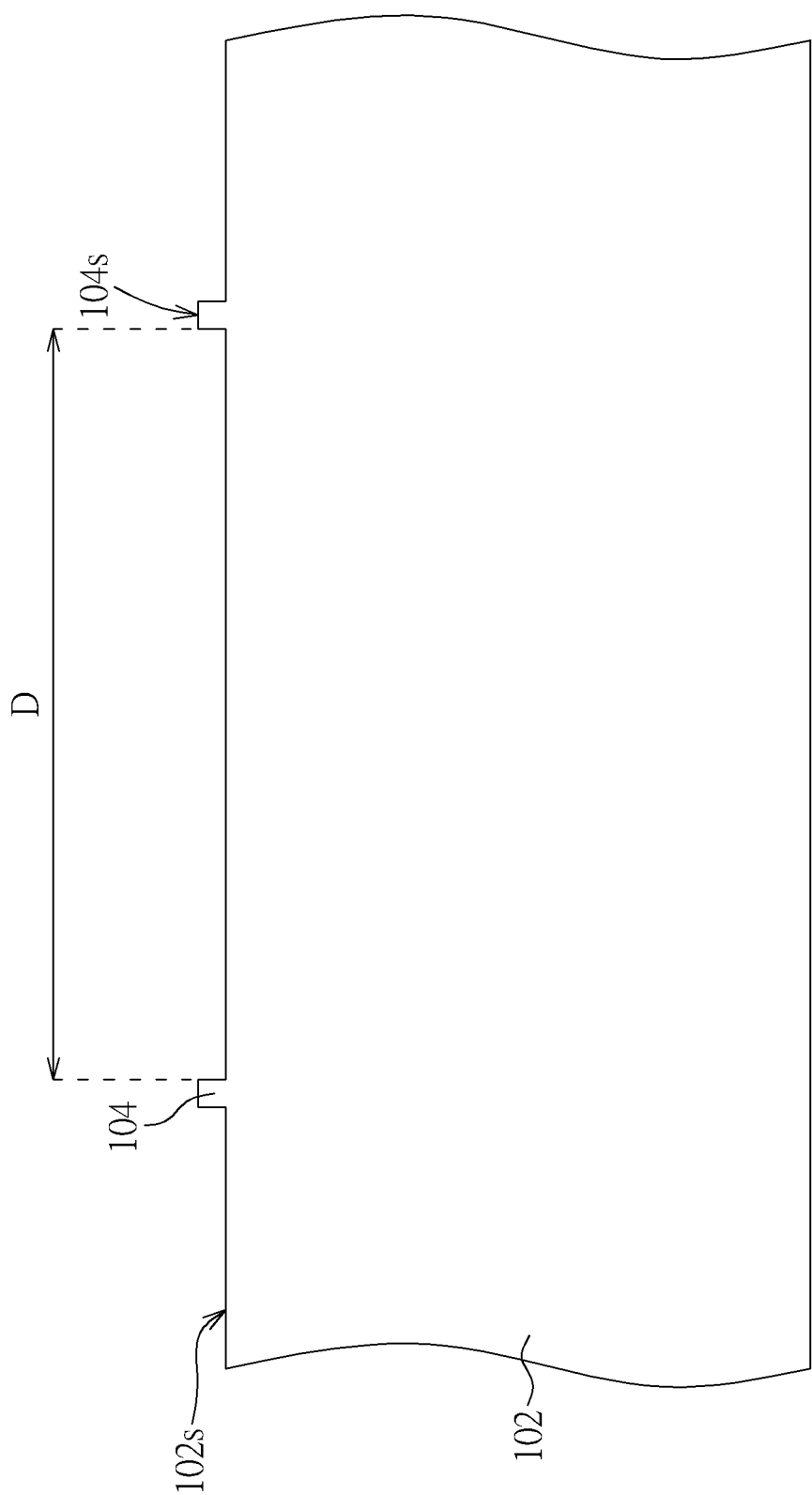
FIG. 3 is a schematic cross-sectional diagram after a stopper is formed on a substrate in accordance with one embodiment of the present disclosure.
Figure 10:
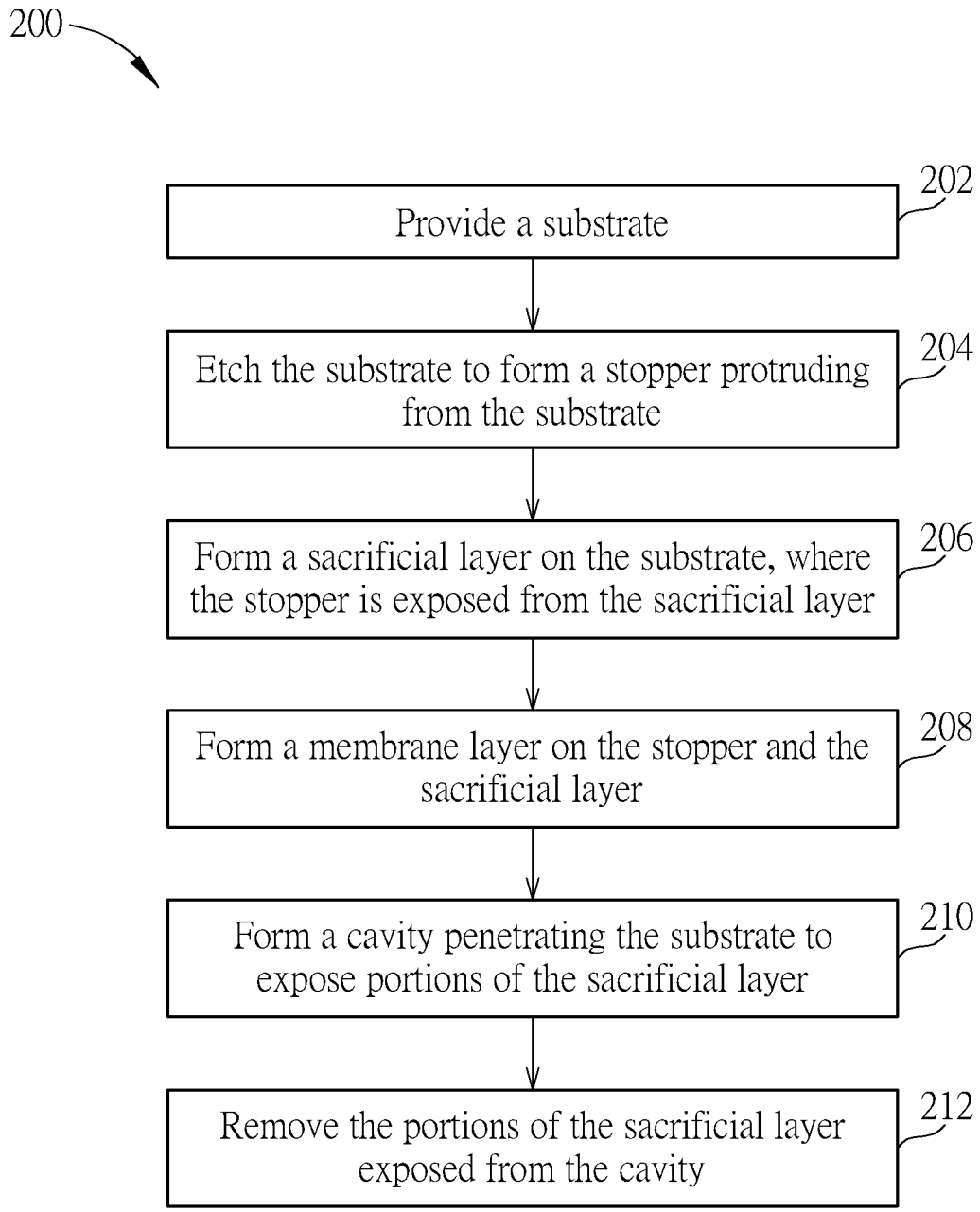
FIG. 10 is a flow chart illustrating a method of fabricating a PMUT in accordance with one embodiment of the present disclosure.

FIG. 3 is a schematic cross-sectional diagram after a stopper is formed on a substrate in accordance with one embodiment of the present disclosure. FIG. 10 is a flow chart illustrating a method of fabricating a PMUT in accordance with one embodiment of the present disclosure. Referring to FIG. 3, in step 202 of a method 200, a substrate 102 is provided, and the substrate 102 may be chosen from semiconductor substrates or insulating substrates depending on different requirements. According to one embodiment of the present disclosure, the substrate 102 may be a single-crystalline silicon substrate. Then, in step 204, the substrate 102 may be etched from it front-side to thereby form a stopper 104 protruding from the top surface 102s of substrate 102. Specifically, photolithography and etching processes may be carried out during the process of fabricating the stopper 104. Because the dimensions of the stopper 104 may be accurately defined by the photolithography, the distance D between two opposite points of the stoppers 104 may be precisely controlled. The distance D well controls the cavity 104 size and the membrane 106 size.

Figure 4:
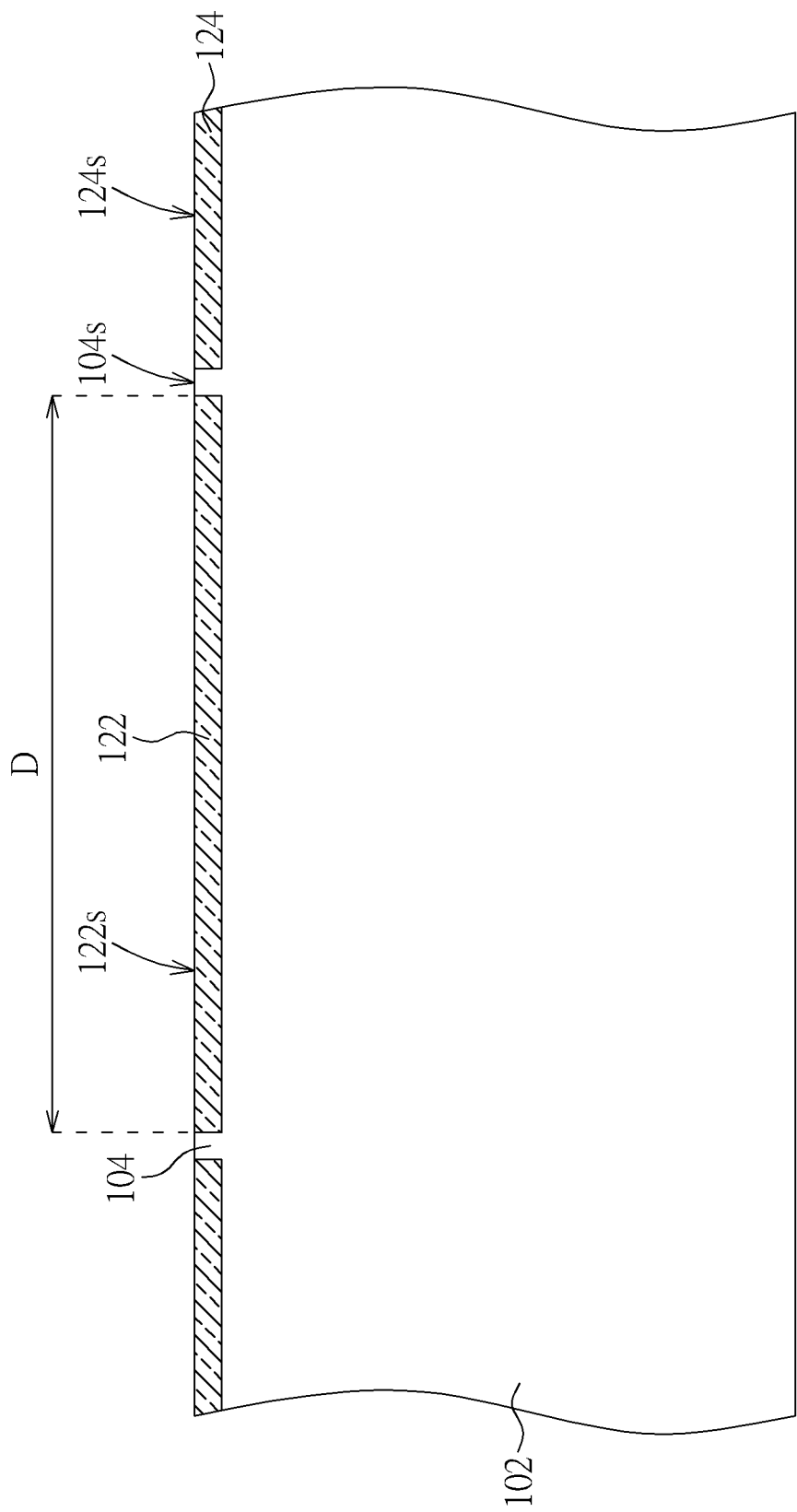
FIG. 4 is a schematic cross-sectional diagram after a sacrificial layer is formed on a substrate in accordance with one embodiment of the present disclosure.

FIG. 4 is a schematic cross-sectional diagram after a sacrificial layer is formed on a substrate in accordance with one embodiment of the present disclosure. Referring to FIG. 4, in step 206, a sacrificial layer including a first portion 122 and a second portion 124 may be formed on the substrate 102, where the top surface of the stopper 104 is exposed from the sacrificial layer. The first portion 122 of the sacrificial layer may be surrounded by the stopper 104, and the second portion 124 of the sacrificial layer may be spaced apart from the first portion 122 by the stopper 104. According to one embodiment of the present disclosure, the process of forming the sacrificial layer may include the following steps: (1) perform a blanket deposition of a sacrificial material (such as chemical vapor deposition or plasma-enhanced chemical vapor deposition) on the substrate 102 to cover the top surface 104s of the stopper 104; and (2) planarize the sacrificial material until the top surface 104s of the stopper 104 is exposed. Besides, according to another embodiment of the present disclosure, the process of forming the sacrificial layer may include the following steps: (1) coat a layer of sacrificial material on the substrate 102 by a spin coating process; and (2) etch the sacrificial material until the top surface 104s of the stopper 104 is exposed. Thus, by any one of the above processes for forming the sacrificial layer, the top surfaces 122s and 124s of the separated portions of the sacrificial layer may be level with the top surface 104s of the stopper 104.

Afterwards, step 208 may be carried out to form a membrane layer on the substrate 120. According to one embodiment of the present disclosure, step 208 may include sub-steps respectively shown in FIG. 5 and FIG. 6.

Figure 5:
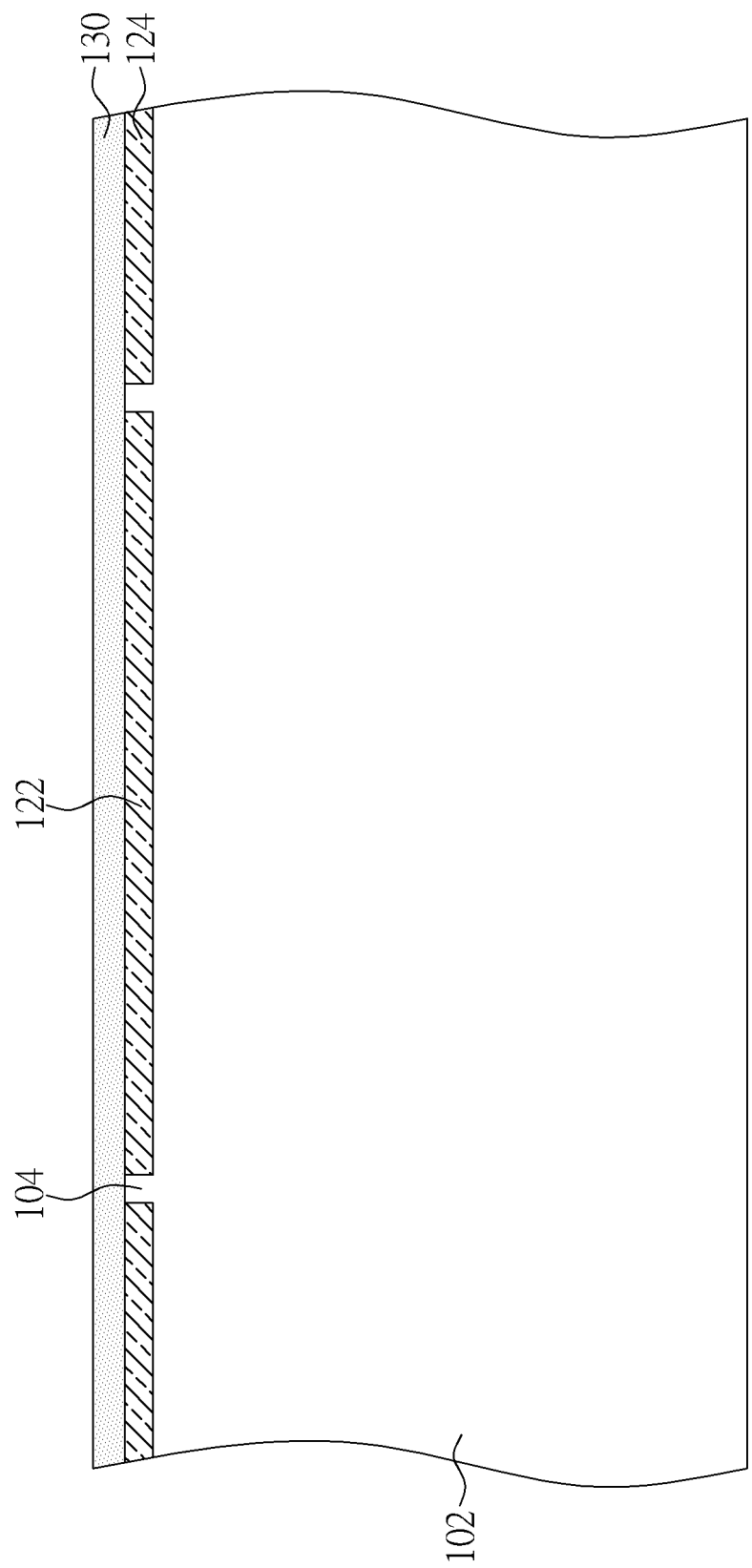
FIG. 5 is a schematic cross-sectional diagram after a base layer is formed on a stopper and a sacrificial layer in accordance with one embodiment of the present disclosure.

FIG. 5 is a schematic cross-sectional diagram after a base layer is formed on a stopper and a sacrificial layer in accordance with one embodiment of the present disclosure. Referring to FIG. 5, a base layer 130 may be deposited on the stopper 104, the first portion 122 of the sacrificial layer, and the second portion 124 of the sacrificial layer. The base layer 130 may be composed of material with suitable elasticity, such as silicon (c-Si), amorphous silicon (a-Si), silicon-rich nitride (SiNx), silicon carbide (SiC), but not limited thereto. Since the stopper 104 and the sacrificial layer 122 and 124 under the base layer 130 have a flat top surface, the bottom surface of the base layer 130 may be also flat. Besides, in order to obtain a flat top surface of the base layer 130, an optional planarization process may be carried out to planarize the top surface of the base layer 130.

Figure 6:
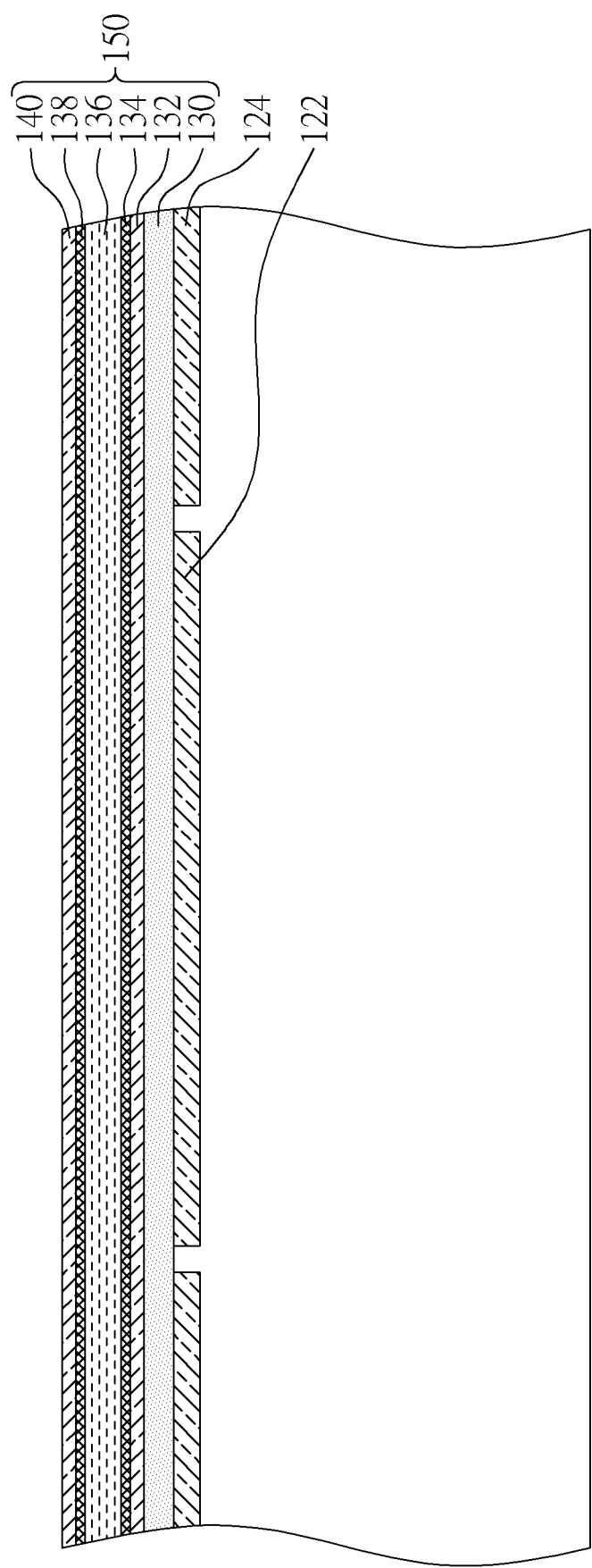
FIG. 6 is a schematic cross-sectional diagram after a stacking layer is formed on a base layer to thereby form a membrane layer in accordance with one embodiment of the present disclosure.

FIG. 6 is a schematic cross-sectional diagram after a stacking layer is formed on a base layer to thereby form a membrane layer in accordance with one embodiment of the present disclosure. Referring to FIG. 6, a dielectric layer 132, a bottom conductive layer 134, a piezoelectric layer 136, a top conductive layer 138, and a passivation layer 140 may be sequentially deposited on the base layer 130, which form a membrane layer 150 on the substrate 120. The dielectric layer 132 may be made of insulating material, such as SiO$_2$, SiON, AlN, or scandium doped AlN (AlScN) used to electrically isolate the bottom conductive layer 134 and the top conductive layer 138 from the base layer 130. According to one embodiment of the present disclosure, the dielectric layer 132 may also function as a seed layer for the layers subsequently deposited on the dielectric layer 132. In addition, the surface texture of the dielectric layer 132 may affect the crystallinity of the layers deposited thereon. The bottom conductive layer 134 and the top conductive layer 138 may be the same or different material composed of molybdenum (Mo), titanium (Ti), aluminum (Al), or platinum (Pt), but not limited thereto. The piezoelectric layer 136 may be composed of aluminum nitride (AlN), scandium doped aluminum nitride (AlScN), lead zirconate titanate (PZT), zinc oxide (ZnO), polyvinylidene fluoride (PVDF), lead mangnesium niobate-lead titanate (PMN-PT), but not limited thereto. The passivation layer 140 may be an optional layer made of insulating material, such as $SiO_2$, SiON, or AlN, but not limited thereto. Besides, the material of the piezoelectric layer 136 is different from that of the base layer 130.

Figure 7:
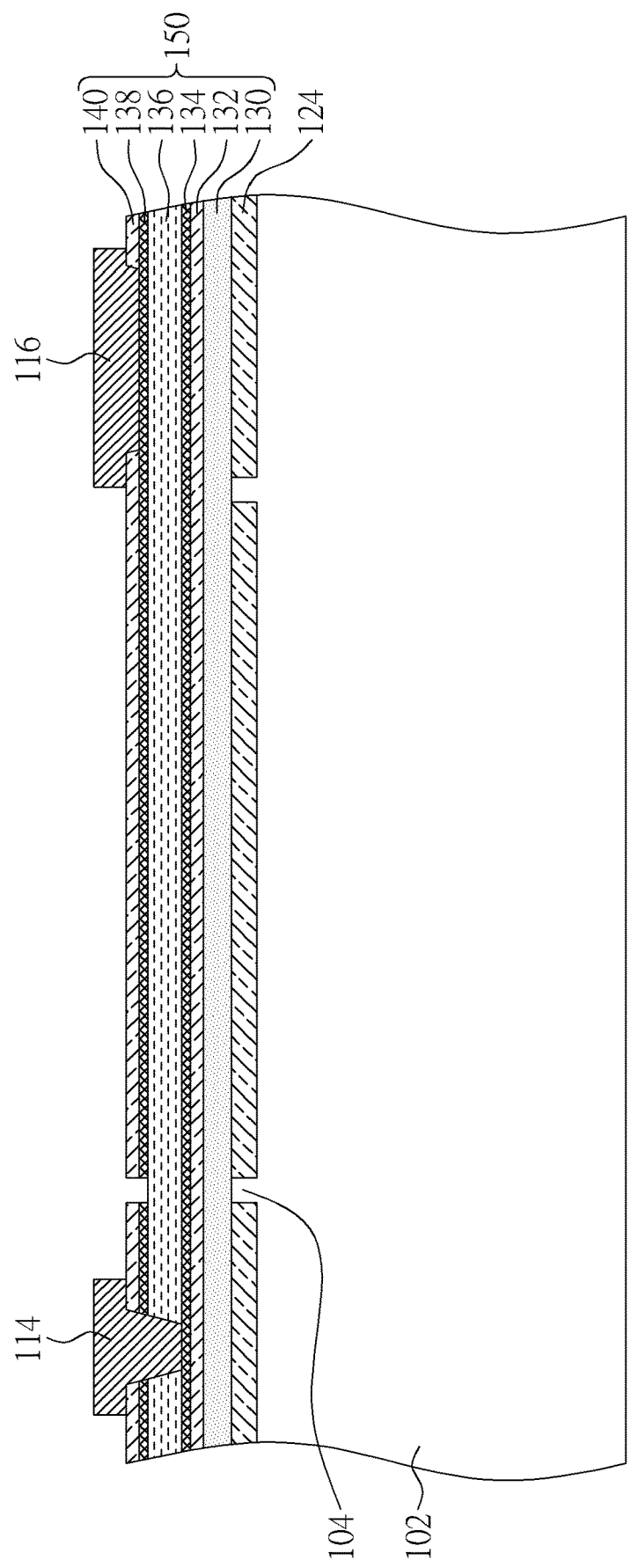
FIG. 7 is a schematic cross-sectional diagram after contact pads are formed in accordance with one embodiment of the present disclosure.

FIG. 7 is a schematic cross-sectional diagram after contact pads are formed in accordance with one embodiment of the present disclosure. Referring to FIG. 7, contact holes may be formed in the membrane layer 150 to respectively expose the bottom conductive layer 134 and the top conductive layer 136, and then contact pads, i.e. a first contact pad 114 and a second contact pad 116, may be filled into each contact hole. In this way, the first contact pad 114 may be electrically coupled to the bottom conductive layer 134, and the second contact pad 116 may be electrically coupled to the top conductive layer 136.

Figure 8:
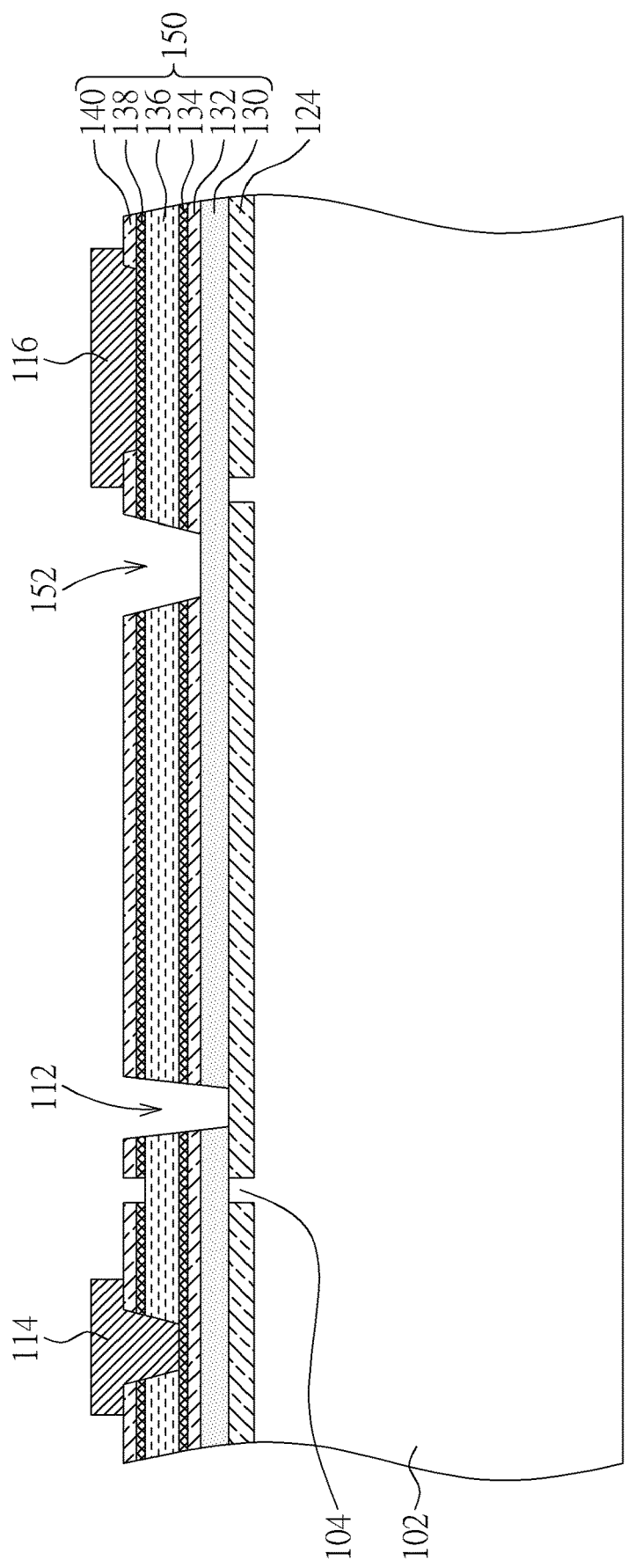
FIG. 8 is a schematic cross-sectional diagram after interrupted portions are formed in a membrane layer in accordance with one embodiment of the present disclosure.

FIG. 8 is a schematic cross-sectional diagram after interrupted portions are formed in a membrane layer in accordance with one embodiment of the present disclosure. Referring to FIG. 8, interrupted portions 112 and 152 may be formed by removing portions of the membrane layer 150. Thus, the first portion 122 of the sacrificial layer may be exposed from the bottom of the interrupted portion 112, and a portion of the base layer 130 may be exposed from the bottom of the interrupted portion 152. According to one embodiment of the present disclosure, although it seems that the interrupted portions 112 and 152 are separated from each other according to FIG. 8, the interrupted portions 112 and 152 may form a continuous slot, such as a ring-shaped slot, when the structure shown in FIG. 8 is viewed in a top-down perspective. Besides, the top view of the shape of the interrupted portions 112 and 152 is not limited to the shape shown in FIG. 1. For example, the interrupted portions 112 and 152 may be a polygon-shaped slot partially surrounding the membrane 106.

Figure 9:
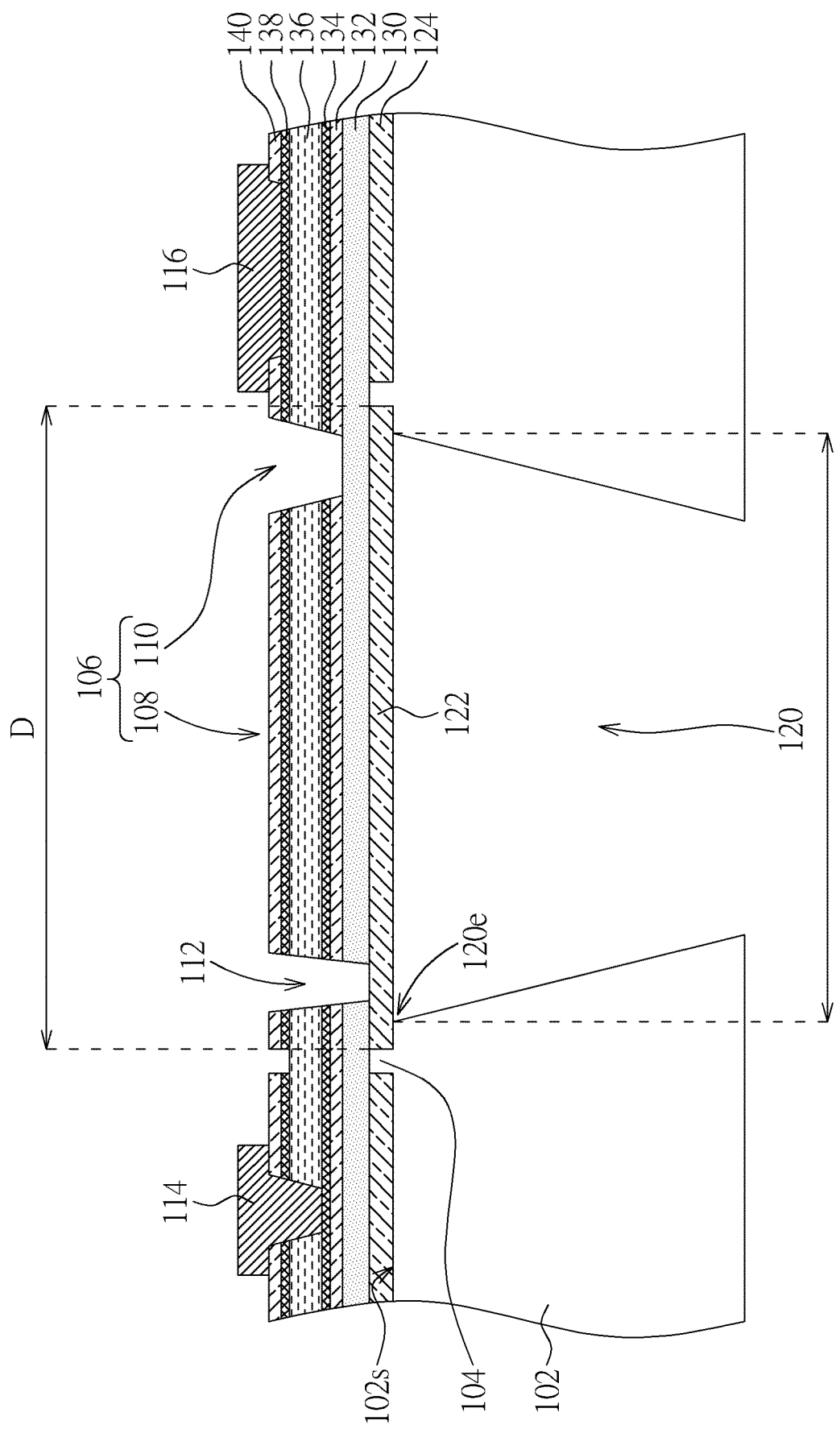
FIG. 9 is a schematic cross-sectional diagram after a cavity penetrating a substrate is formed in accordance with one embodiment of the present disclosure.

FIG. 9 is a schematic cross-sectional diagram after a cavity penetrating a substrate is formed in accordance with one embodiment of the present disclosure. Referring to FIG. 9, in step 210, a cavity 120 penetrating the substrate 102 may be formed by etching the backside of the substrate 102. Thus, the bottom of the first portion 122 of the sacrificial layer may be exposed from the cavity 120. The cavity 120 may have an opening O defined by the edge 120e of the cavity 120 in proximity to the membrane.

On the front-side of the substrate 102, and the length defined by the opening O may be less than the distance D defined by the opposite points of the stopper 104. Since the distance D used to define the position of the membrane of the PMUT is mainly determined by the stopper 104, the position and dimension of the membrane of the PMUT may still not change even if there is a slight shift in the position or dimension of the opening O.

Afterwards, in step 212, an etching process may be conducted to remove the first portion 122 of the sacrificial layer exposed from the cavity 120. The etchants may be vapor fluoric acid (VHF) when the sacrificial layer is made of silicon oxide. Since an etch selectivity of the sacrificial layer to the stopper 104 and the base layer 130 is greater than 10 during the step of removing the sacrificial layer exposed from the cavity 120, only the first portion 122 of the sacrificial layer may be removed. Besides, because the etchants are prevented by the stopper 104 from reaching the second portion 124 of the sacrificial layer, the second portion 124 of the sacrificial layer may not be removed during the etching process. As a result, a structure of FIG. 2 having a released membrane may be obtained.

According to the embodiments of the present disclosure, since the stopper 104 is fabricated by etching the front-side of the substrate 102, the stopper 104 may be tightly attached to the substrate 102 without peeling off from the substrate and may have vertical sidewall. Besides, the dimension and position of the membrane 106 may be precisely defined independently of the dimension and position of the cavity 120 underneath the membrane 106. Accordingly, the uniformity of the resonant frequency of each PUMT 100 may be increased effectively, which also improves the reliability and electrical performance of each PMUT.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A piezoelectric micromachined ultrasonic transducer (PMUT), comprising:
   a substrate having an cavity penetrating the substrate;
   a stopper protruding from a top surface of the substrate and surrounding an edge of the cavity, wherein the stopper is formed by etching the substrate; and
   a membrane disposed over the cavity and attached to the stopper,
   wherein the substrate and the stopper are composed of same material comprising single-crystalline silicon, poly-crystalline silicon, amorphous silicon, glass, or ceramic.

2. The PMUT of claim 1, wherein the edge of the cavity is in proximity to the membrane.

3. The PMUT of claim 1, wherein the stopper is a ring-shaped, polygon-shaped, or arc-shaped structure disposed along an edge of the membrane.

4. The PMUT of claim 1, wherein the membrane is a multilayer structure.

5. The PMUT of claim 4, wherein the multilayer structure comprises:
   a base layer;
   a dielectric layer disposed on the base layer;
   two conductive layers stacked on the base layer; and
   a piezoelectric layer disposed between the conductive layers.

6. The PMUT of claim 5, wherein a material of the base layer is different from the piezoelectric layer.

7. The PMUT of claim 1, further comprising an interrupted portion penetrating the membrane.

8. The PMUT of claim 7, wherein the stopper is disposed along a perimeter of the interrupted portion.

9. The PMUT of claim 1, further comprising a sacrificial layer disposed on a top surface of the substrate and surrounding the stopper, and the etch selectivity of sacrificial layer over the stopper and the base layer is greater than 10 when vapor fluoric acid (VHF) is used as etchant.

10. The PMUT of claim 9, wherein a top surface of the sacrificial layer is level with a top surface of the stopper.

11. A method of fabricating a piezoelectric micromachined ultrasonic transducer (PMUT), comprising:
   providing a substrate;
   etching the substrate to form a stopper protruding from the substrate;

forming a sacrificial layer on the substrate, wherein the stopper is exposed from the sacrificial layer;

forming a membrane layer on the stopper and the sacrificial layer;

forming a cavity penetrating the substrate to expose portions of the sacrificial layer; and removing the portions of the sacrificial layer exposed from the cavity using the stopper as an etch stop structure.

12. The method of claim 11, wherein the stopper is a ring-shaped, polygon-shaped, or arc-shaped structure disposed along an edge of the membrane.

13. The method of claim 11, wherein the substrate and the stopper are composed of same single-crystalline material.

14. The method of claim 11, wherein the step of forming the sacrificial layer on the substrate comprises:

depositing a sacrificial material on the substrate and the stopper; and planarizing the sacrificial material to expose the stopper.

15. The method of claim 11, wherein the membrane layer is a multilayer structure comprising:

a base layer;

a dielectric layer disposed on the base layer;

two conductive layers stacked on the base layer; and a piezoelectric layer disposed between the conductive layers.

16. The method of claim 11, further comprising forming an interrupted portion penetrating the membrane layer.

17. The method of claim 16, wherein the stopper is disposed along a perimeter of the interrupted portion.

18. The method of claim 11, wherein, when the step of forming the sacrificial layer on the substrate is completed, the sacrificial layer comprises:

a first portion surrounded by the stopper; and a second portion spaced apart from the first portion by the stopper.

19. The method of claim 18, wherein the second portion of the sacrificial layer remains on the substrate when the step of removing the portions of the sacrificial layer exposed from the cavity is completed.

20. The method of claim 11, wherein an etch selectivity of the sacrificial layer to the stopper is greater than 10 during the step of removing the portions of the sacrificial layer exposed from the cavity.

\* \* \* \* \*